(12) United States Patent
Feichtinger (10) Patent No.: US 9,978,912 B2
(45) Date of Patent: May 22, 2018

(54) CARRIER FOR AN LED

(71) Applicant: EPCOS AG, Munich (DE)

(72) Inventor: Thomas Feichtinger, Graz (AT)

(73) Assignee: EPCOS AG, Munich (DE)

( * ) Notice: Subject to any disclaimer, the term of this patent is extended or adjusted under 35 U.S.C. 154(b) by 0 days. days.

(21) Appl. No.: 15/501,162

(22) PCT Filed: Aug. 7, 2015

(86) PCT No.: PCT/EP2015/068280
§ 371 (c)(1),
(2) Date: Feb. 1, 2017

(87) PCT Pub. No.: WO2016/020537
PCT Pub. Date: Feb. 11, 2016

(65) Prior Publication Data
US 2017/0229617 A1     Aug. 10, 2017

(30) Foreign Application Priority Data

Aug. 8, 2014   (DE) .................. 10 2014 111 363
Oct. 22, 2014  (DE) .................. 10 2014 115 375

(51) Int. Cl.
| | |
|---|---|
| H01L 33/48 | (2010.01) |
| H01L 33/62 | (2010.01) |
| H01L 33/64 | (2010.01) |
| H01C 7/12 | (2006.01) |
| H01L 25/075 | (2006.01) |

(52) U.S. Cl.
CPC ............ *H01L 33/486* (2013.01); *H01C 7/12* (2013.01); *H01L 33/62* (2013.01); *H01L 33/644* (2013.01); *H01L 25/0753* (2013.01)

(58) Field of Classification Search
CPC .............................. H01L 33/62; H01L 33/644
See application file for complete search history.

(56) References Cited

U.S. PATENT DOCUMENTS

| | | | |
|---|---|---|---|
| 9,177,703 B2* | 11/2015 | Feichtinger | ............. H01C 7/10 |
| 9,196,402 B2 | 11/2015 | Feichtinger et al. | |
| 2002/0001712 A1 | 1/2002 | Higuchi | |
| 2005/0184387 A1 | 8/2005 | Collins, III et al. | |
| 2006/0232373 A1 | 10/2006 | Kanazawa et al. | |
| 2007/0200133 A1* | 8/2007 | Hashimoto | ........... H01L 33/486 |
| | | | 257/100 |
| 2007/0297108 A1* | 12/2007 | Collins, III | ............ H01C 7/112 |
| | | | 361/56 |
| 2009/0020876 A1 | 1/2009 | Hertel et al. | |
| 2011/0084294 A1* | 4/2011 | Yao | ....................... H01L 27/153 |
| | | | 257/93 |
| 2011/0188161 A1 | 8/2011 | Feichtinger et al. | |

(Continued)

FOREIGN PATENT DOCUMENTS

| | | |
|---|---|---|
| DE | 102008024479 A1 | 12/2009 |
| JP | 2006295079 A | 10/2006 |

(Continued)

*Primary Examiner* — Thao P Le
(74) *Attorney, Agent, or Firm* — Slater Matsil, LLP (57) ABSTRACT

A carrier for an LED is disclosed. In an embodiment, the carrier includes a main body, wherein the carrier has an upper side on which a first contact area for attaching an LED is arranged, and wherein a protective device for protecting the LED from electrostatic discharges is integrated in the main body.

20 Claims, 6 Drawing Sheets

(56) References Cited

U.S. PATENT DOCUMENTS

2011/0309404 A1* 12/2011 Lee ................. H01L 33/486
                                                    257/99
2015/0144983 A1* 5/2015 Feichtinger ........... H01L 25/167
                                                    257/99

FOREIGN PATENT DOCUMENTS

| JP | 2008109079 A | 5/2008 |
| JP | 2008270325 A | 11/2008 |
| JP | 2011523778 A | 8/2011 |
| JP | 2011187855 A | 9/2011 |
| JP | 2014116411 A | 6/2014 |
| WO | 2007058438 A1 | 5/2007 |
| WO | 2009141437 A1 | 11/2009 |
| WO | 2009141439 A1 | 11/2009 |

* cited by examiner

CARRIER FOR AN LED

This patent application is a national phase filing under section 371 of PCT/EP2015/068280, filed Aug. 7, 2015, which claims the priority of German patent application 10 2014 111 363.2, filed Aug. 8, 2014 and German patent application 10 2014 115 375.8, filed Oct. 22, 2014, all of which are incorporated herein by reference in their entirety.

TECHNICAL FIELD

The present invention relates to a carrier for an LED (light-emitting diode). The carrier is suitable for having an LED attached, for example, soldered, on it and for providing the LED with electrical contact.

BACKGROUND

In the design of LED carrier systems, the light yield, lifetime and thermal management are assuming an increasingly important role. Apart from the functional demands, there are also thermomechanical and geometrical problems to solve. Especially in the case of mobile applications, for example, an integrated LED camera flash in smartphones or digital cameras, the LED and the carrier are to require as little space as possible and the smallest possible overall height.

A further requirement for a carrier for an LED is that the upper side is as far as possible free from other components, in order to avoid shielding of the light emitted by the LED.

For thermal management, it is intended that between the LED, the carrier and the carrier surface there is a thermal contact that is as good as possible.

The carrier is additionally intended to have a device for protection from electrostatic discharges (ESD), since LEDs are very sensitive to such discharges. In the case of the known carriers for LEDs, corresponding protective components are therefore provided as discrete devices on the upper side of the carrier. This may however be disadvantageous both with regard to the overall height and space requirement of the carrier and with regard to the radiation characteristics of an LED mounted on the carrier.

Furthermore, a carrier for LEDs should be designed such that, when the carrier is soldered on a printed circuit board, the connection between the LED and the carrier does not melt and an alignment of the LED is not changed.

SUMMARY OF THE INVENTION

Embodiments of the invention provide an improved carrier that is, for example, advantageous at least with regard to one of the aforementioned aspects.

Embodiments provide a carrier for an LED, the carrier having a main body and there being integrated in the main body a protective device for protecting an LED attached on the carrier from electrostatic discharges.

The carrier also has an upper side, on which at least one contact area for attaching the LED is arranged. The LED may preferably be attached on the at least one contact area by soldering.

By contrast with the known carriers, the protective device is consequently not arranged on an upper side of the carrier but is integrated in the carrier. Consequently, the overall height and the space requirement of the carrier are not increased by the protective device. The carrier according to the invention consequently makes improved miniaturization possible. Furthermore, the upper side of the carrier is now free from the protective device, so that the light radiation characteristics of an LED mounted on the carrier are not influenced by the protective device.

The term protective device may refer here in particular to a device that is designed for protecting an LED from damage caused by an excessive applied voltage, as occurs for instance in the case of electrostatic discharges. The protective device may be designed to reduce such a voltage without subjecting the LED to any load.

The carrier may be suitable for the mounting of at least one LED. In further exemplary embodiments, the carrier may be suitable for the attachment of multiple LEDs. For example, the carrier may have contact areas onto which multiple LEDs, for example, three, can be soldered. The multiple LEDs may in this case have different colors from one another.

If the carrier has contact areas that are suitable for the attachment of multiple LEDs, the carrier may also be designed in such a way that the LEDs attached on the carrier are interconnected to one another by way of the contact areas and by way of metallic areas applied to the main body of the carrier. The metallic areas may serve for the electrical contacting of the LEDs. For example, the metallic areas may extend to the underside of the carrier and serve for providing contact with a printed circuit board.

Two contact areas may be arranged on the upper side of the carrier, the contact areas being arranged in such a way that a central region that is free from the contact areas is arranged between the contact areas on the upper side of the carrier, at least one thermal via that connects the central region of the upper side of the carrier to the underside of the carrier being arranged in the main body. If an LED is attached on the contact areas, a gap may form between the central region of the upper side of the carrier and the LED. Heat radiated from the LED can collect in this gap. The thermal via that connects the central region of the upper side to the underside of the carrier may then make it possible to dissipate this heat efficiently.

The regions of the upper side in which the contact areas are arranged are free from vias. Alternatively, it may also be the case that only the regions of the upper side in which an LED to be attached on the contact areas lies on the contact areas are free from vias. The vias may have adverse effects on the coplanarity and the surface roughness of the contact areas. To avoid this, the vias may be arranged such that they do not lie in the regions of the contact areas.

In this way, contact areas with low coplanarity and low surface roughness can be achieved.

In particular, the at least one contact area may have a coplanarity of less than 3 μm and/or a surface roughness of less than 1 μm. Apart from the arrangement described above of the vias, this can also be achieved by internal electrodes that are integrated in the carrier and/or metallic plates of a heat spreader that are integrated in the carrier being aligned parallel to an upper side of the carrier. In this case, they do not intersect the surface of the carrier, and consequently do not lead to any impairment of the planarity of the surface.

The main body may comprise a ceramic material. In particular, the main body may comprise zinc oxide-praseodymium (ZnO—Pr) or zinc oxide-bismuth (ZnO—Bi). These materials can make it possible to design the protective device as a varistor. The materials have a voltage-dependent resistance. Only when there is a voltage between internal electrodes integrated in the main body that exceeds a predetermined threshold value does the resistance of the ceramic material suddenly become lower, so that only then can a current flow through the protective device and thus protect the LED from the excessive voltage.

The protective device may have internal electrodes integrated in the main body. The internal electrodes may comprise Ag—Pd. Alternatively, other materials are also conceivable, for example, silver, palladium or platinum.

The internal electrodes may be aligned parallel to the upper side of the carrier. This alignment may allow the upper side to be made planar to the maximum degree.

The protective device may be designed in such a way that a current can flow through the protective device when the voltage between the internal electrodes exceeds a predetermined value.

Furthermore, the carrier may have metallic areas for the electrical contacting of the LED, which are arranged on the main body and extend from an upper side of the main body, on which a contact area for soldering on the LED is arranged, to an underside of the main body, which is arranged opposite from the upper side.

The metallic areas may in this case be in direct electrical contact with the contact area for soldering on the LED, in particular on the upper side of the main body. The carrier may also be a surface mounted device (SMD), which is suitable for soldering on a printed circuit board. In this case, electrical contact with the printed circuit board may be formed by way of the metallic areas, which reach to the underside of the main body. The metallic areas may consequently establish electrical contact between an LED mounted on the carrier and a printed circuit board.

Furthermore, the metallic areas are advantageous for thermal management. During operation, the LED arranged on the carrier will radiate heat. In this case, heat is also radiated from the underside of the LED onto the upper side of the carrier. The contact areas, which are arranged on the upper side of the carrier, may consist of metal and have a good thermal conductivity. The contact areas may in particular pass on a substantial proportion of the heat that is radiated onto the carrier directly to the metallic areas. Since the metallic areas are arranged on the outer areas of the main body, they can radiate heat well to the surrounding vicinity of the carrier. Consequently, the metallic areas make it possible to remove the heat quickly and thus avoid overheating of the carrier and the LED.

In addition, the carrier may have further metallic areas on the outer areas of the main body. These further metallic areas may serve for the electrical contacting of the LED. They may however also only perform a thermal function and contribute to the removal of heat.

The metallic areas and/or the contact areas may have a layered structure comprising silver, nickel and gold or silver, nickel and tin.

Furthermore, a heat spreader may be integrated in the carrier. The heat spreader may serve the purpose of quickly reducing heat radiated from an LED mounted on the carrier. In this way, the heat spreader can make the thermal management of the carrier considerably easier.

The heat spreader may have metallic plates integrated in the main body, which are in thermal contact with the metallic areas on the main body of the carrier. In this way, heat radiated from the LED into the carrier can easily be reduced, in that the heat is passed on via the metallic plates to the metallic areas and from there is radiated to the surrounding vicinity. The metallic plates of the heat spreader may comprise Ag—Pd.

The metallic plates of the heat spreader may be aligned parallel to the upper side of the carrier.

The heat spreader may be arranged closer to an upper side of the carrier than the integrated internal electrodes. It is decisive for the function of the spreader that it is arranged as close as possible to the LED, in order to be well able to capture the heat radiated from the LED.

Contact areas for the soldering on of an LED may be provided on the upper side of the main body. An LED may be soldered on these contact areas, for example, by eutectic soldering or a gold-gold interconnect.

The carrier may be a surface mounted device, which is suitable for soldering on a printed circuit board.

The carrier may have contact areas for the attachment of multiple LEDs. The carrier may in this case also be designed in such a way that the multiple LEDs are interconnected to one another by a corresponding design of the contact areas. Alternatively, the carrier may in this case be designed in such a way that each of the LEDs is contacted by way of the correspondingly designed external electrodes.

The contact area for attaching the LED may have a stacked structure, which has at least one gold layer and one tin layer, the heights of the at least one gold layer and the at least one tin layer being chosen such that in the stacked structure there is a ratio of gold to tin of between 75:25 and 85:15, preferably of 80:20. This design can make it possible for the melting temperature to be lowered, for example, down to 300° C. to 320° C.

Advantageous aspects of the present invention are described below. In order to make it easier to refer from one aspect back to another, the aspects are consecutively numbered. Features of the aspects may not only be relevant to the respective aspect but also interact with features of another aspect.

1. Carrier for an LED having a main body, there being integrated in the main body a protective device for protecting an LED mounted on the carrier from electrostatic discharges. 2. Carrier according to aspect 1, wherein the main body comprising a ceramic material. 3. Carrier according to one of the preceding aspects, wherein the main body comprising zinc oxide-praseodymium or zinc oxide-bismuth. 4. Carrier according to one of the preceding aspects, wherein the protective device having internal electrodes integrated in the main body. 5. Carrier according to aspect 4, wherein the internal electrodes comprising Ag—Pd. 6. Carrier according to either of aspects 4 and 5, wherein the protective device being designed in such a way that a current can flow through the protective device when the voltage between the internal electrodes exceeds a predetermined value. 7. Carrier according to one of the preceding aspects, wherein the carrier having metallic areas for the electrical contacting of the LED, which are arranged on the main body and extend from an upper side of the main body, on which a contact area for soldering on the LED is arranged, to an underside of the main body, which is arranged opposite from the upper side. 8. Carrier according to aspect 7, wherein the metallic areas and/or the contact areas having a layered structure comprising silver, nickel and gold or silver, nickel and tin. 9. Carrier according to one of the preceding aspects, wherein a heat spreader that has metallic plates integrated in the main body being integrated in the carrier. 10. Carrier according to aspect 9, wherein the metallic plates of the heat spreader being in contact with the metallic areas. 11. Carrier according to either of aspects 9 and 10, wherein the heat spreader being arranged closer to an upper side of the carrier than the integrated internal electrodes. 12. Carrier according to one of the preceding aspects, wherein the carrier being a surface mounted device, which is suitable for soldering on a printed circuit board. 13. Carrier according to one of the preceding aspects wherein the carrier has contact areas for the attachment of multiple LEDs.

BRIEF DESCRIPTION OF THE DRAWINGS

The invention is explained in more detail below on the basis of the figures.

DETAILED DESCRIPTION OF ILLUSTRATIVE EMBODIMENTS

Figure 1:
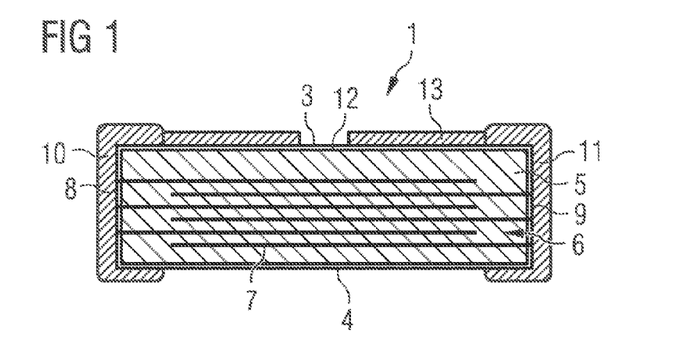
FIG. 1 shows a cross section through a carrier according to a first exemplary embodiment.
Figure 2:
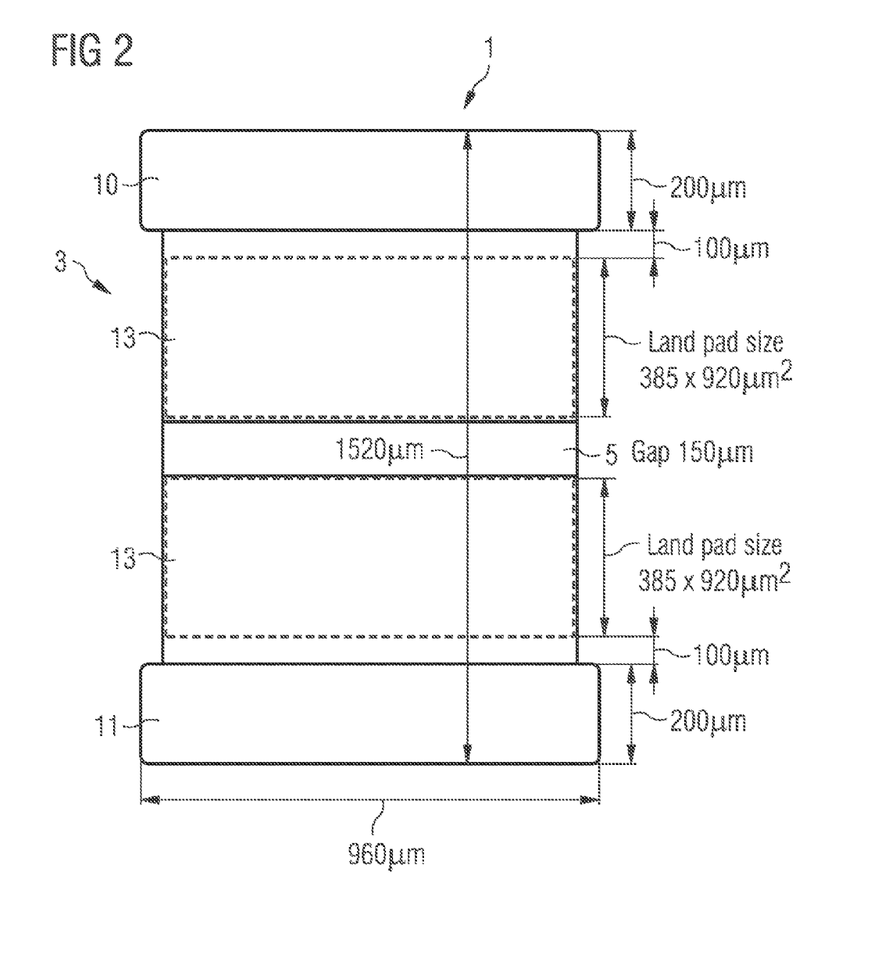
FIG. 2 shows a plan view of an upper side of the carrier according to the first exemplary embodiment.
Figure 3:
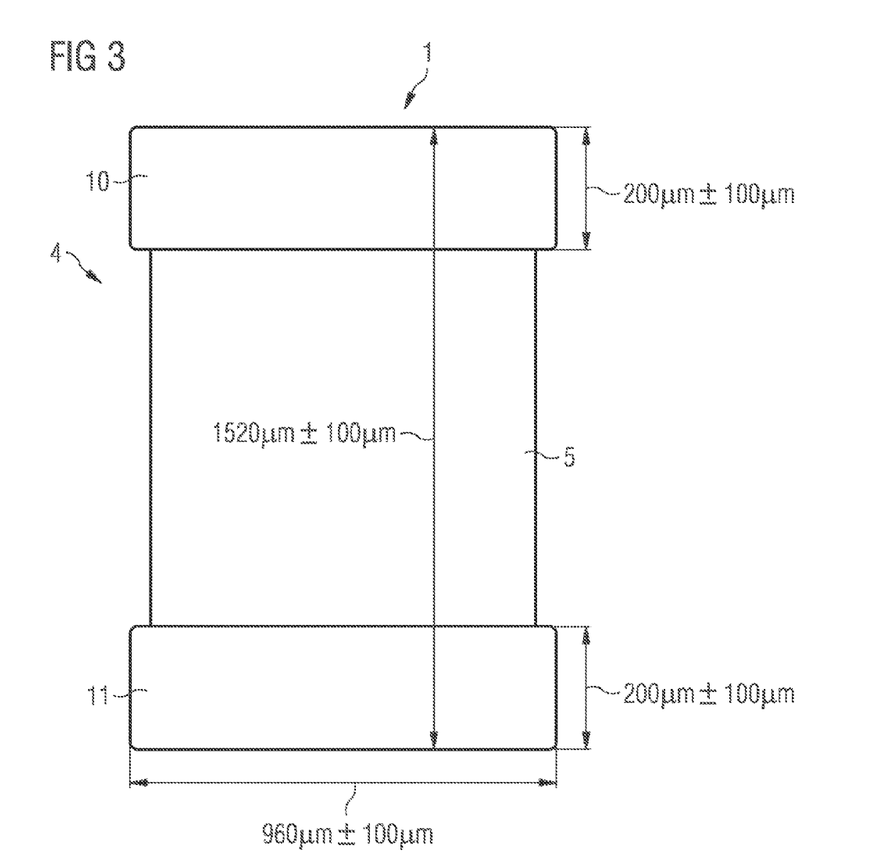
FIG. 3 shows a plan view of an underside of the carrier according to the first exemplary embodiment.
Figure 4:
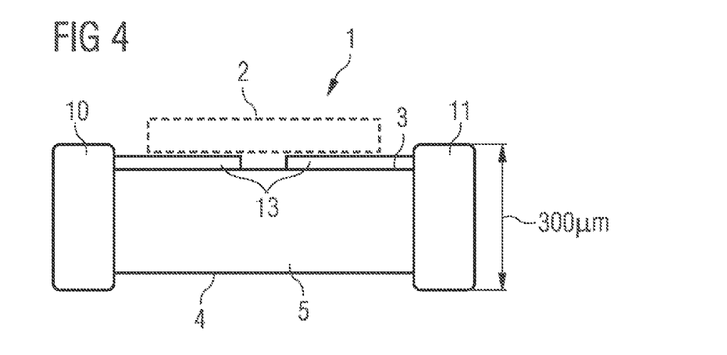
FIG. 4 shows a side view of the carrier according to the first exemplary embodiment.

FIGS. 1 to 4 show a first exemplary embodiment of a carrier 1 for an LED 2. FIG. 1 shows a cross section through the carrier 1. FIG. 2 shows a plan view of an upper side 3 of the carrier 1. FIG. 3 shows a plan view of an underside 4 of the carrier. FIG. 4 shows a side view of the carrier 1. In FIG. 4, an LED 2 mounted on the carrier 1 is also indicated by a dashed line.

The carrier 1 is a surface mounted device (SMD). Accordingly, the carrier 1 is suitable for being attached on a surface of a printed circuit board (not shown) by means of solder.

The carrier 1 is also designed to have an LED 2 mounted on it. In particular, the carrier 1 is designed to have an LED 2 attached on it by means of soldering.

The carrier 1 has a main body 5. The main body 5 is substantially cuboidal. The main body 5 comprises a ceramic material. In particular, the main body 5 consists of the ceramic material. The ceramic material may be zinc oxide-praseodymium or zinc oxide-bismuth.

A protective device 6 for protecting an LED 2 mounted on the carrier 1 from electrostatic discharges (ESD) is integrated in the main body 5. The protective device 6 has internal electrodes 7 integrated in the main body 5.

Each of the internal electrodes 7 extends in a plane parallel to the upper side 3 of the carrier 1, the upper side 3 of the carrier 1 being the side on which the LED 2 can be attached. The internal electrodes 7 are therefore aligned parallel to the upper side 3 of the carrier 1. This alignment is also referred to as vertical alignment of the internal electrodes 7.

In a direction from the upper side 3 of the carrier 1 to the underside 4 of the carrier 1, which lies opposite from the upper side 3, the internal electrodes 7 alternately extend either up to a first end face 8 of the carrier 1 or up to a second end face 9 of the carrier 1. On the first end face 8 of the carrier 1, a first metallic area 10 has been applied. The first metallic area 10 extends over the entire length of the first end face 8 and reaches both onto the upper side 3 and onto the underside 4 of the main body 5. On the second end face 9 of the carrier 1, a second metallic area 11 has been applied. The second metallic area 11 extends over the entire length of the second end face 9 and reaches both onto the upper side 3 and onto the underside 4 of the main body 5. In the direction from the upper side 3 to the underside 4, the internal electrodes 7 are alternately in contact with the first metallic area 10o and the second metallic area 11.

The first and second metallic areas 10, 11 comprise Ag, Ni and/or Au. In particular, the metallic areas 10, 11 may have a stacked structure comprising Ag, Ni and Au, with Ag forming the lowermost layer. Instead of Au, Sn may also be used.

The first and second metallic areas 10, 11 provide electrical contact with an LED 2 mounted on the carrier 1. The protective device is consequently designed in such a way that a voltage that is applied to the LED 2 from the two metallic areas 10, 11 also lies between the internal electrodes 7.

The protective device forms a varistor. With customary voltages between the internal electrodes 7, no current can flow through the ceramic material of the main body 5, since the ceramic material has too high a resistance. However, this resistance is voltage-dependent. If the voltage between two adjacent internal electrodes exceeds a predetermined threshold value, the resistance of the ceramic material suddenly falls. Then a current can flow between the adjacent internal electrodes 7 and the voltage present can be reduced. In this way it is provided that, when high voltages occur, such as for instance due to an electrostatic discharge, this voltage is prevented from causing damage to the LED 2. The protective device 6 ensures that the voltage is reduced by way of the protective device 6 without subjecting the LED 2 to any load.

The internal electrodes 7 comprise silver-palladium (Ag—Pd) or consist of silver-palladium.

Furthermore, the main body 5 is enclosed by a glass passivation 12. The first and second metallic areas 10, 11 are arranged outside on the glass passivation 12. Internal electrodes 7 reach through the glass passivation 12, and are consequently in electrical contact with the first and second metallic areas 10, 11.

Two contact areas 13 are arranged on the upper side 3 of the carrier 1. The contact areas 13 comprise Ag, Ni and/or Au. In particular, the contact area may have a stacked structure comprising Ag, Ni and Au, with Ag forming the lowermost layer. Instead of Au, Sn may also be used. As indicated in FIG. 4, an LED 2 may be attached on the contact areas 13 of the carrier 1. The contact areas 13 are designed such that the LED 2 can be soldered onto the contact areas 13 in a eutectic soldering process. This may be, for example, a eutectic silver-lead soldering process. Alternatively or in addition, the contact areas 13 may be designed such that the LED 2 can be attached on the contact areas 13 in a gold-gold interconnect (GGI) bonding process. A eutectic soldering process makes it possible to lower the melting point of a solder.

The carrier 1 may have still further contact areas 13 for the mounting of further LEDs 2.

The first and second metallic areas 10, 11 have a greater thickness than the contact areas 13.

Alternatively, the contact areas 13 may have a stacked structure, which has at least one layer comprising gold and a layer comprising tin. Preferably, at least one layer of the stacked structure consists of gold and at least one layer consists of tin.

The stacked structure may, for example, have a titanium base layer arranged directly on the upper side 3. A nickel layer may be arranged over the titanium base layer. A first gold layer, a first tin layer, a second gold layer and a second tin layer may be arranged—in this sequence—over the nickel layer. The titanium base layer may be created by means of sputtering and have, for example, a height of 0.1 µm. The further layers of the stacked structure may be created galvanically. The nickel layer may have a height of 2 µm. The gold layers may have a height of 0.8 µm. The tin layers may have a height of 0.2 µm.

The heights of the gold and tin layers may be made to match one another so as to obtain in the stacked structure of the contact areas 13 a ratio of gold to tin of between 75:25 and 85:15, preferably of 80:20. This ratio leads to a lowering of the melting temperature of the contact areas. In this way, a melting temperature of between 300° C. and 320° C. can be achieved. In this way, eutectic soldering can be made possible.

The sputtering on of a base layer and the subsequent galvanic creation of further layers of the contact areas 13 lying thereover allow contact areas 13 that have a particularly low coplanarity and a particularly low surface roughness to be produced. For example, the contact areas 13 may have a coplanarity of less than 3 µm. Furthermore, the contact areas 13 may have a surface roughness of less than 1 µm.

The carrier 1 has a height of between 100 µm and 500 µm, preferably between 150 µm and 350 µm. The height indicates here the distance from the upper side 3 to the underside 4 of the carrier 1. The carrier 1 also has a width of between 200 µm and 2000 µm, preferably between 350 µm and 1600 µm. The carrier 1 also has a length of between 100 µm and 1500 µm, preferably between 150 µm and 100 µm. The width indicates here the extent of the carrier 1 in the direction of the normal to the surface of the end faces 8, 9. The length indicates the extent of the carrier 1 in a direction along the end faces 8, 9 and perpendicular to the direction of the connection of the upper side 3 and the underside 4.

Furthermore, the carrier 1 may have on its underside 4 at least one thermal contact area (not shown). The thermal contact area can improve thermal contact of the carrier 1 with a printed circuit board on which the carrier 1 is mounted. The thermal contact area may comprise Ag, Ni and/or Au. In particular, the thermal contact area may have a stacked structure comprising Ag, Ni and Au, it being possible for Ag to be arranged directly on the main body 5. Instead of Au, Sn may also be used.

Figure 5:
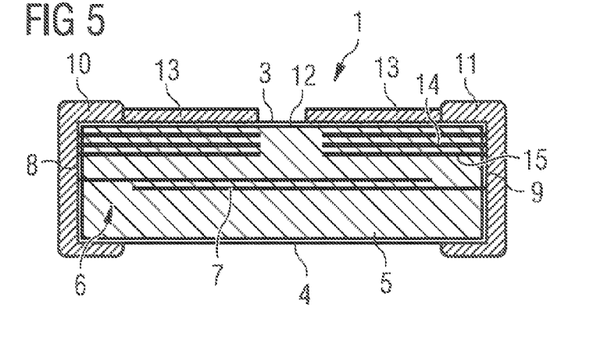
FIG. 5 shows a carrier according to a second exemplary embodiment.

FIG. 5 shows a second exemplary embodiment of the carrier 1. The carrier 1 according to the second exemplary embodiment additionally has a heat spreader 14, which is integrated in the main body 5 of the carrier 1. The heat spreader 14 has metallic plates 15. The metallic plates 15 of the heat spreader 14 are subdivided into two groups. The metallic plates 15 of the first group are connected to the first metallic area 10 on the first end face 8. The metallic plates 15 of the second group are connected to the second metallic area 11 on the second end face 9.

During operation, an LED 2 mounted on the carrier 1 may radiate a great amount of heat. The heat is thereby also radiated into the carrier 1. The metallic plates 15 of the heat spreader 14 serve the purpose of quickly removing heat produced. They thereby assist the removal of heat by way of the metallic areas 10, 11, and consequently provide an even better removal of heat.

In this way, overheating of an LED 2 mounted on the carrier 1 and of the main body 5 of the carrier 1 can be avoided. The heat is removed from the metallic plates 15 to the respective metallic area 10, 11, from where the heat can be radiated more easily. The metallic plates 15 of the heat spreader 14 comprise silver-palladium or consist of silver-palladium.

Figure 6:
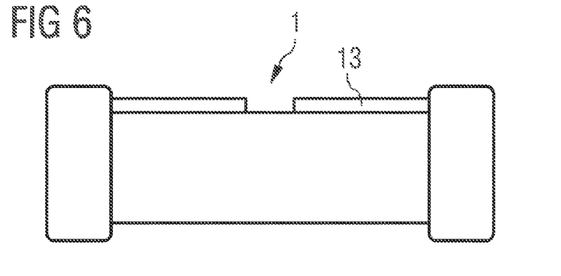
FIGS. 6 to 8 show the attachment of an LED on the carrier.
Figure 7:
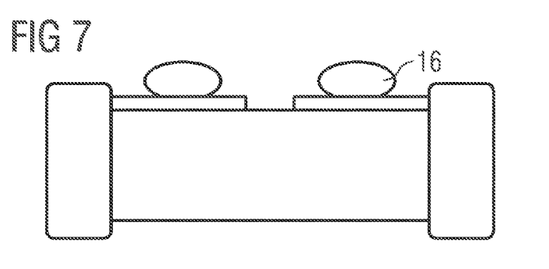
Figure 8:
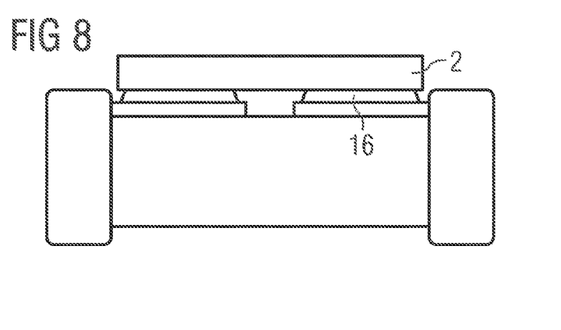

FIGS. 6, 7 and 8 show how an LED 2 is mounted on the carrier 1. In FIG. 6, the carrier 1 is first depicted without an LED 2. FIG. 7 shows the carrier 1 after a first mounting step, in which solder 16 has been applied to the contact areas 13 of the carrier 1. FIG. 8 shows the carrier 1 after the LED 2 has been attached on the carrier 1. The LED 2 is placed onto the contact areas 13, the solder 16 providing a mechanical connection of the carrier 1 to the LED 2. The solder 16 is subsequently hardened.

Figure 9:
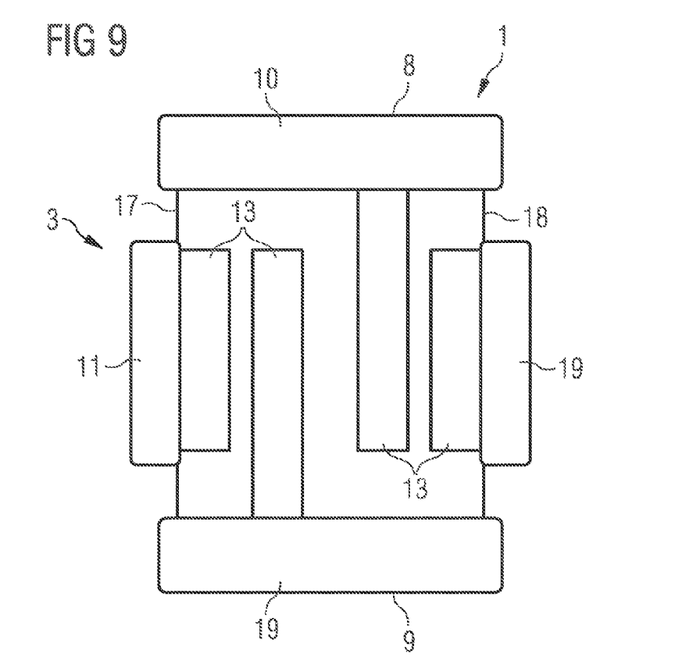
FIG. 9 shows a third exemplary embodiment of the carrier.

FIG. 9 shows a third exemplary embodiment of a carrier 1. In FIG. 9, a plan view of the upper side 3 of the carrier 1 is represented. A total of four contact areas 13 are arranged on the upper side 3. Each of the contact areas 13 is in electrical contact by way of in each case a metallic area 10, 11, 19. Apart from the first and second metallic areas 10, 11, the carrier has for this purpose further metallic areas 19. In this case, each of the metallic areas 10, 11, 19 extends from the upper side 3 of the carrier 1 over one of the end faces 8, 9 or one of the outer sides 17, 18 to the underside 4 of the carrier 1. The outer sides 17, 18 respectively connect the upper side 3 and the underside 4 and are perpendicular to the end faces 8, 9. The carrier 1 shown in FIG. 9 is designed for the attachment of two LEDs.

Figure 10:
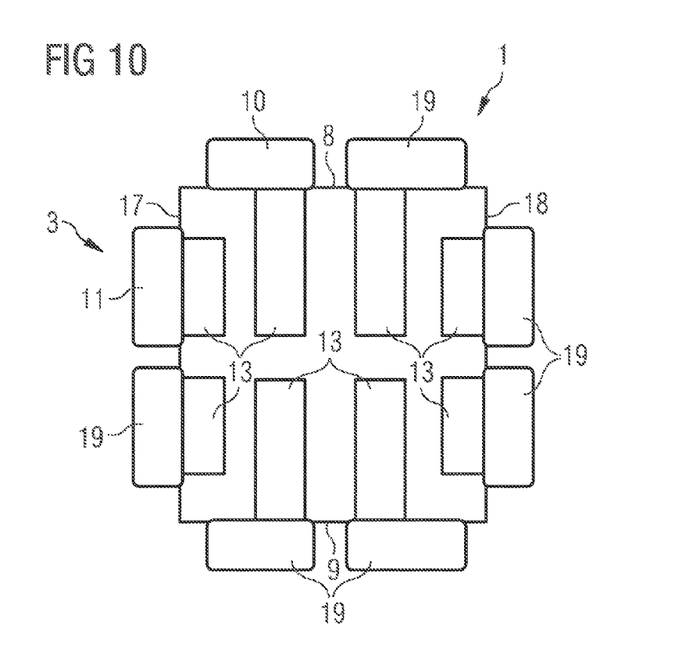
FIG. 10 shows a fourth exemplary embodiment of the carrier.

FIG. 10 shows a fourth exemplary embodiment of a carrier 1. Also in FIG. 10, a plan view of the upper side 3 of the carrier 1 is represented. A total of eight contact areas 13 are arranged on the upper side 3, so that the carrier is suitable for being loaded with four LEDs. Each of the contact areas 13 is in electrical contact by way of in each case a metallic area 10, 11, 19. In this case, each of the metallic areas 10, 11, 19 extends from the upper side 3 of the carrier 1 over one of the end faces 8, 9 or one of the outer sides to the underside 4 of the carrier 1.

Figure 11:
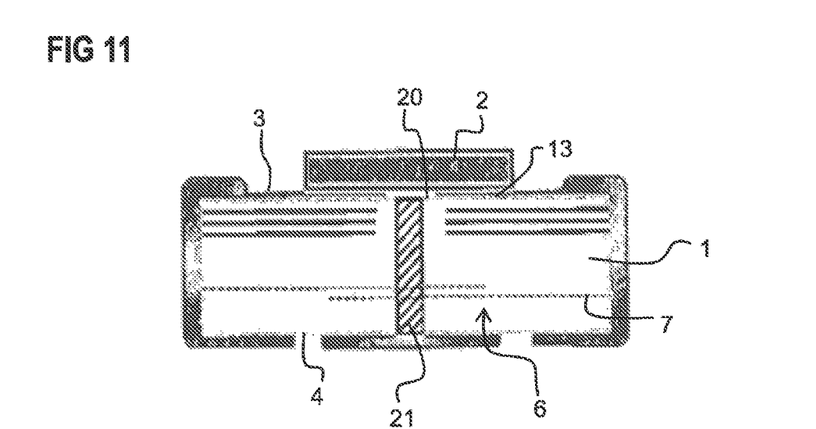
FIGS. 11 and 12 show a fifth exemplary embodiment of the carrier.
Figure 12:
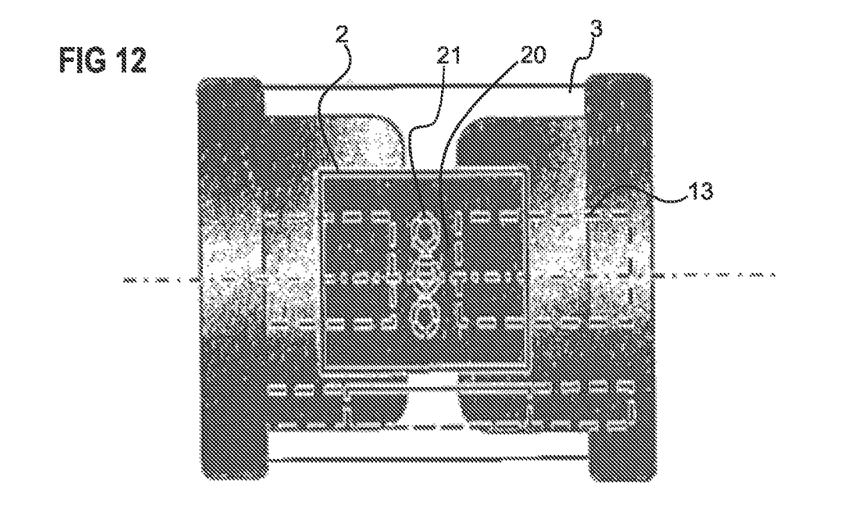

FIGS. 11 and 12 show a fifth exemplary embodiment of the carrier 1. FIG. 11 shows a cross section and FIG. 12 shows a plan view.

Two contact areas 13, on which an LED can be soldered, are arranged on the upper side 3 of the carrier 1. Between the contact areas there is a central region 20 of the upper side 3. Once the LED 2 is attached on the contact areas 13, a gap between the LED 2 and the carrier 1 forms in the central region.

The carrier also has at least one thermal via 21, which connects the central region of the upper side 3 to the underside 4 of the carrier. Here, the carrier 1 has three thermal vias. The thermal vias make it possible to dissipate heat radiated into the gap from the LED 2 to the underside. In this way, the thermal vias make a thermal improvement of the structure possible.

Figure 13:
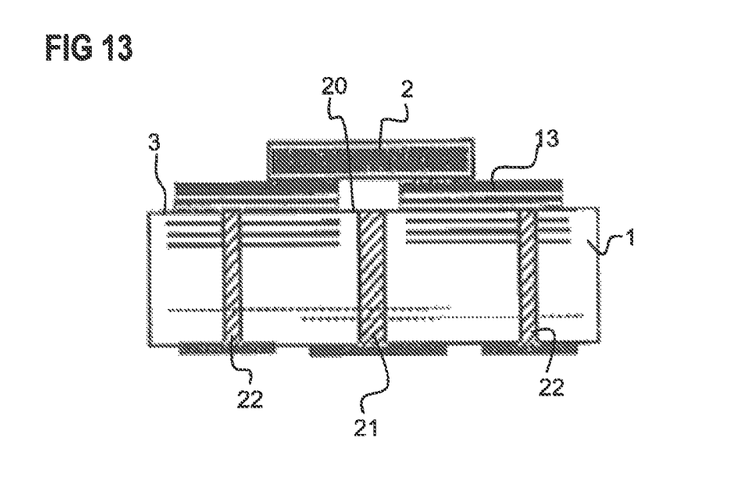
FIGS. 13 and 14 show a sixth exemplary embodiment of the carrier.
Figure 14:
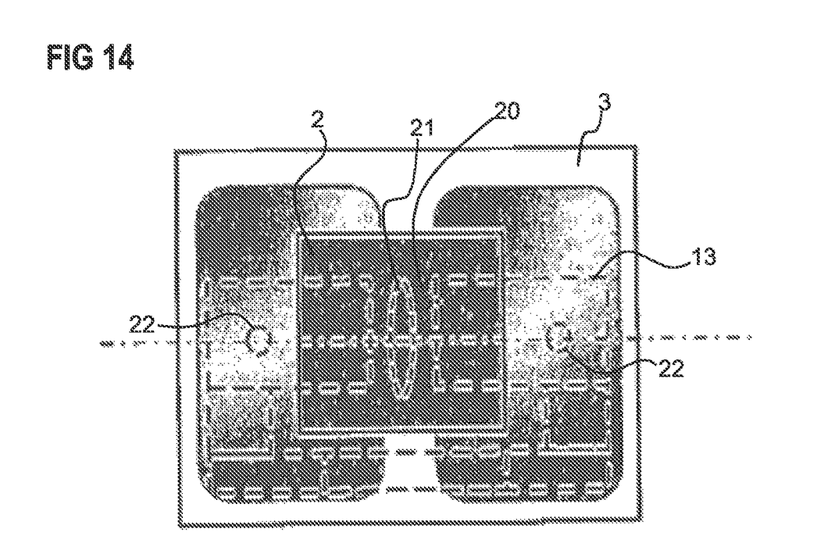

FIGS. 13 and 14 show a sixth exemplary embodiment of the carrier.

The carrier has no metallic areas 10, 11. Instead, the carrier has further vias 22, which serve for the contacting of the contact areas 13 and the contacting of the internal electrodes integrated in the main body. The further vias 22 lie against the contact areas 13 in the regions on which the LED 2 does not directly lie. Consequently, they do not disturb the coplanarity and the surface roughness of the contact areas 13 in the regions in which the LED 2 lies on the contact areas 13.

The contact areas 13 have the stacked structure described above, which has a ratio of gold to tin of 80:20.

The invention claimed is:

1. A carrier comprising:
   a main body;
   a first contact area for attaching an LED arranged on an upper side of the carrier;
   a second contact area arranged on the upper side of the carrier, wherein the first and second contact areas are arranged in such a way that a central region that is free from contact areas is located between the first and second contact areas on the upper side of the carrier;
   at least one thermal via located in the main body that connects the central region of the upper side of the carrier to an underside of the carrier; and
   a protective device for protecting the LED from electrostatic discharges integrated in the main body.

2. The carrier according to claim 1, wherein regions of the upper side in which the first and second contact areas are arranged are free from vias.

3. The carrier according to claim 1, wherein the first contact area has a coplanarity of less than 3 µm.

4. The carrier according to claim 1, wherein the first contact area has a surface roughness of less than 1 µm.

5. The carrier according to claim 1, wherein the first contact area has a coplanarity of less than 3 µm and a surface roughness of less than 1 µm.

6. The carrier according to claim 1, wherein the main body comprises a ceramic material.

7. The carrier according to claim 1, wherein the protective device has internal electrodes integrated in the main body, and wherein the internal electrodes are aligned parallel to the upper side of the carrier.

8. The carrier according to claim 7, wherein the protective device is designed in such a way that a current flows through the protective device when a voltage between the internal electrodes exceeds a predetermined value.

9. The carrier according to claim 1, wherein the carrier has metallic areas for electrical contacting of the LED, which are arranged on the main body and extend from an upper side of the main body to an underside of the main body, which is arranged opposite from the upper side.

10. The carrier according to claim 9, wherein the metallic areas have a layered structure comprising silver, nickel and gold or silver, nickel and tin.

11. The carrier according to claim 1, further comprising a heat spreader having metallic plates, wherein the heat spreader is integrated in the main body.

12. The carrier according to claim 11, wherein the metallic plates of the heat spreader are aligned parallel to the upper side of the carrier.

13. The carrier according to claim 11, wherein the carrier has metallic areas for electrical contacting of the LED, which are arranged on the main body and extend from an upper side of the main body to an underside of the main body, which is arranged opposite from the upper side, and wherein the metallic plates of the heat spreader are in contact with the metallic areas.

14. The carrier according to claim 11, wherein the protective device has internal electrodes integrated in the main body, and wherein the heat spreader is arranged closer to an upper side of the carrier than the integrated internal electrodes are.

15. The carrier according to claim 1, wherein the carrier is a surface mounted device, which is suitable for being soldered on a printed circuit board.

16. The carrier according to claim 1, wherein the carrier has contact areas for attaching multiple LEDs.

17. The carrier according to claim 1, wherein the first contact area has a stacked structure comprising at least one gold layer and at least one tin layer, wherein heights of the at least one gold layer and the at least one tin layer are chosen such that the stacked structure comprises a ratio of gold to tin of between 75:25 and 85:15.

18. A carrier comprising:
    a main body;
    at least one contact area for attaching an LED arranged on an upper side of the carrier;
    a second contact area arranged on the upper side of the carrier, wherein the first and second contact areas are arranged in such a way that a central region that is free from contact areas is located between the first and second contact areas on the upper side of the carrier;
    at least one thermal via located in the main body that connects the central region of the upper side of the carrier to an underside of the carrier; and
    a protective device for protecting the LED from electrostatic discharges integrated in the main body, and
    wherein the at least one contact area has a coplanarity of less than 3 µm or wherein the at least one contact area has a surface roughness of less than 1 µm.

19. A carrier comprising:
    a main body;
    at least one contact area for attaching an LED arranged on an upper side of the carrier;
    a second contact area arranged on the upper side of the carrier, wherein the first and second contact areas are arranged in such a way that a central region that is free from contact areas is located between the first and second contact areas on the upper side of the carrier;
    at least one thermal via located in the main body that connects the central region of the upper side of the carrier to an underside of the carrier; and
    a protective device for protecting the LED from electrostatic discharges integrated in the main body,
    wherein the at least one contact area has a stacked structure, which has at least one gold layer and at least one tin layer, and wherein heights of the at least one gold layer and the at least one tin layer are chosen such that the stacked structure comprises a ratio of gold to tin of between 75:25 and 85:15.

20. A carrier comprising:
    a main body;
    a first contact area for attaching an LED arranged on an upper side of the carrier;
    a protective device for protecting the LED from electrostatic discharges integrated in the main body; and
    a heat spreader having metallic plates integrated in the main body,
    wherein the carrier has metallic areas for electrical contacting the LED, wherein the metallic areas are arranged on the main body and extend from an upper side of the main body to an underside of the main body arranged opposite from the upper side,
    wherein the metallic plates of the heat spreader are in contact with the metallic areas, and
    wherein the metallic plates of the heat spreader connected to one metallic area are not overlapping with the metallic plates of the heat spreader connected to the another metallic area.

* * * * *

UNITED STATES PATENT AND TRADEMARK OFFICE
CERTIFICATE OF CORRECTION

PATENT NO. : 9,978,912 B2
APPLICATION NO. : 15/501162
DATED : May 22, 2018
INVENTOR(S) : Feichtinger It is certified that error appears in the above-identified patent and that said Letters Patent is hereby corrected as shown below:

In Column 10, Line 22, Claim 18, delete "in the main body, and" and insert --in the main body,--.

Signed and Sealed this
Thirty-first Day of July, 2018

Andrei Iancu
*Director of the United States Patent and Trademark Office*